(12) United States Patent
Gentinne et al.

(10) Patent No.: US 6,525,592 B2
(45) Date of Patent: Feb. 25, 2003

(54) INTEGRATED SINE WAVE GENERATING CIRCUIT

(75) Inventors: Bernard Gilbert Guy Gentinne, Oudergem (BE); Pavel Konecny, Brno-Lesna (CZ); Ludek Pantucek, Svitavka (CZ)

(73) Assignee: AMI Semiconductor Belgium BVBA, Oudenaarde (BE)

( * ) Notice: Subject to any disclaimer, the term of this patent is extended or adjusted under 35 U.S.C. 154(b) by 0 days.

(21) Appl. No.: 09/897,075

(22) Filed: Jul. 3, 2001

(65) Prior Publication Data

US 2002/0017945 A1 Feb. 14, 2002

(30) Foreign Application Priority Data

Jul. 12, 2000 (EP) .............................. 00402008

(51) Int. Cl.[7] ............................... H03K 17/56
(52) U.S. Cl. ...................... 327/423; 327/110
(58) Field of Search ................. 327/423, 424, 327/110, 432, 111, 112

(56) References Cited

U.S. PATENT DOCUMENTS 4,950,919 A * 8/1990 Rossi et al. ................. 327/423
5,952,856 A * 9/1999 Horiguchi et al. .......... 327/110
5,973,368 A   10/1999 Pearce et al. ............... 257/368
5,973,569 A   10/1999 Nguyen ...................... 330/298
6,111,458 A * 8/2000 Ideler ......................... 327/423
6,198,315 B1 * 3/2001 Nakano ....................... 327/110

FOREIGN PATENT DOCUMENTS

| DE | 3831176 A1 | 3/1990 |
| EP | 0 817 371 A1 | 1/1998 |
| EP | 1 104 109 A1 | 5/2001 |

* cited by examiner

Primary Examiner—Tuan T. Lam
(74) Attorney, Agent, or Firm—Sughrue Mion, PLLC

(57) ABSTRACT

The invention relates to an integrated high power sine wave carrier circuit for outputting a low distortion high power sine wave. The circuit is used for antennas, and especially for antennas in automotive appliances. The circuit comprises a H-bridge (2) with matched power transistors (4, 6, 8, 10), a sine generator (24) for driving the H-bridge and a regulator (22) for sensing the power applied to the antenna and controlling the current amplitude of the sine wave output by the sine generator. The circuit operates under partial timeworking, whereby the integration circuit is turned on or off. The circuit therefore comprises a shutdown pin, for shutting the circuit down in order to allow cooling. The partial time operation allows the circuit to be integrated on a single die.

15 Claims, 2 Drawing Sheets

INTEGRATED SINE WAVE GENERATING CIRCUIT

BACKGROUND OF THE INVENTION

The invention relates to a circuit for generating a sine wave for an automotive appliance antenna.

Antennas of automotive appliances are driven through a power H-bridge by a low distorted carrier sine wave. FIG. 1 shows diagrammatically a prior art circuit for such an antenna. The antenna 1 is driven by a power bridge circuit 2, comprised of four power transistors 4, 6, 8 and 10 mounted on a printed circuit board 12. The circuit is a discrete component power bridge, this being symbolized in FIG. 1 by the boxes around each of the transistors. In a way known per se, the emitter of transistor 4 is connected to the emitter of transistor 6, thus forming a first leg of the H-bridge. The emitter of transistor 10 is connected to the emitter of transistor 8, thus forming a second leg of the H-bridge. The antenna is connected to the middle section of both legs of the H-bridge circuit—that is on one hand between transistors 4 and 6 and on the other hand between transistors 8 and 10. The top section of both legs of the H-bridge—that is the collectors of transistors 4 and 10—is connected to power supply 16, whereas the bottom section of both legs of the H-bridge circuit—that is the collectors of transistors 6 and 8—is connected to one terminal of a sense resistor 18, the other terminal of which is grounded. Thus, sense resistor 18 receives a voltage image of the current applied to antenna 1.

FIG. 1 further shows an integrated circuit 20, comprising a regulator 22 and a sine wave generator 24. The one terminal of the sense resistor 18 is connected to one pin of the integrated circuit, and is inputted to the regulator 22. The regulator also receives on another pin of the integrated circuit a reference signal SETP representative of the amplitude of the signal to be applied to the antenna. The regulator outputs to the sine generator a SET signal representative of a difference between the voltage across sense resistor 18 and the reference signal SETP.

Sine generator circuit receives the SET signal, and digital inputs DIG-IN representative of the frequency of the sine wave to be applied to the antenna. Based on the SET signal and on these inputs, the sine generator outputs four control signals respectively applied to the bases of the transistors 4, 6 and 8, 10 forming each leg of the H-bridge circuit.

The operation of the circuit of FIG. 1 is the following. As explained above, sense resistor 18 receives a voltage image of the current applied to antenna 1; voltage across sense resistor 18 is compared in regulator 22 to reference voltage SETP so as to control amplitude of the sine wave output by sine generator 24. Frequency of the sine wave is controlled by the digital inputs to regulator 22. FIG. 1 does not show the circuits for modulating the sine wave carrier applied to the antenna.

Typical values of voltages and powers in the circuit of FIG. 1 are the following. Power supply SUPP 16—the automotive appliance battery—usually outputs a voltage below 16 V. Antenna 1 has a resistance between 5 and 15 ohms, and its current may reach 0.5 A. Power dissipation in the H-bridge circuit is around 6 W. It is also required that the sine wave for driving the antenna be a low distortion signal. The rejection for the second harmonic frequency is preferably higher than 30 dB, while the rejection for the third harmonic frequency and higher harmonic frequencies is preferably higher than 35 dB.

The design of FIG. 1 causes a number of problems. First, there is a need to assemble the different components of the power H-bridge on the printed circuit board PCB, and then a need to assemble the power H-bridge with the regulator and sine generator chip, and with the load. These steps of assembly increase the costs of the antenna circuits. Second, the power transistors mounted on the PCB are separate components, and may hardly be matched; this increases power consumption, notably due to quiescent current of the H-bridge at crossover. Moreover, such discrete implementation is prone to reliability problems due to potential connection failures.

In view of high power dissipation in the H-bridge circuit—around 6 W and in any case higher than 3 W—there is a general prejudice in the art against assembling all components of the circuit on a single die; more specifically, there is a prejudice against using an integrated component for the H-bridge circuit.

SUMMARY OF THE INVENTION

The invention addresses these problems. It provides a simple solution, in an integrated circuit. Mounting all components of the circuit on a single die addresses the problems of assembly costs and reliability problem encountered in the prior art solution as mentioned above. In addition, integrating transistors of the H-bridge circuits allows the transistor to be matched. Quiescent current at crossover is better controlled, and current amplitude may be set more accurately.

European patent application with patent application number 99402881.9 filed before the present application but published after the filing date of the present application discloses a sine wave generator for providing a high power and low distortion current sine wave. The generator disclosed in this document comprises a load feeding power bridge connected to the output of a sine wave generator, and a regulator inserted between the feedback output of the power bridge and a reference voltage input of the sine wave generator. The regulator includes regulation means providing a power regulation signal to the reference voltage input of the sine wave generator; the regulation signal is derived from the comparison between a signal at the feedback output of the power bridge and a set point signal. In this application, the regulator is a proportional integrating differentiating regulator; it includes start-up and/or shut-off envelope controlling means, as well as regulation means for obtaining a tightly controlled start-up and/or shut-off slope(s) of the signal at the load feeding output of the power bridge in addition to a tight control of the signal envelope between a start-up slope and the following shut-off slope. The regulator of this document is not necessarily integrated on a single die.

The invention provides a high power sine wave carrier circuit, comprising a power bridge connected to the output of a sine generator, a regulator connected to a feedback output of the power bridge and providing a driving signal to the sine generator, wherein said power bridge, said sine generator and said sine regulator are integrated on a single die, and wherein said circuit further comprises a shutdown pin.

The invention further relates to such a high power sine wave carrier circuit wherein the sine wave at the output of said power bridge has a rejection higher than 30 dB for the second harmonic frequency and a rejection higher than 35 dB for the third and higher harmonic frequencies.

A further characteristic feature of such a circuit is that the power of the sine wave at the output of said power bridge is higher than 1 W.

Another characteristic feature of the circuit is that the internal power of the circuit is higher than 1.5 W.

Yet, another characteristic feature of such a circuit is that, the shutdown pin controls operation of said power bridge, said regulator and said sine generator.

Still another feature is that the power bridge is a H-bridge.

Another feature of the circuit is that the power bridge is a push-pull bridge with matched transistors.

Furthermore, the invention provides a process for applying a high power sine wave to a load connected to the output of a power bridge of a circuit according to one of previous circuits, comprising the steps of powering and shutting down the circuit, wherein:

the duty cycle between said powering and shutting down steps is determined according to a maximum average temperature of the die;

the maximum duration of a powering step is determined according to temperature at any point within the die; and in any time period equal to the ratio of said maximum duration to said duty cycle, the energy applied to the circuit is less than an upper limit, said upper limit being the energy applied to the circuit by a powering step of said maximum duration.

The process further comprises that the duty cycle is equal or less than:

$$\frac{\theta max - \theta air}{R \cdot (I_0 \cdot V_{supply} + I_{load} \cdot (V_{supply} - V_{load}))}$$

where $l_0$ is the internal current in the circuit, $V_{supply}$ is the voltage applied to the circuit, $l_{load}$ is the RMS value of the current in the load in a powering step, $V_{load}$ is the RMS value of the voltage across the load, R is the thermal resistance between the die and the air around the die, $\theta max$ is the maximum average temperature of the die, and $\theta air$ the temperature of the air around the die.

The process further comprises that the maximum duration of a powering step is determined so that the temperature at any point within the die is less than a maximum operating temperature.

Finally the process comprises that the maximum duration of a powering step is determined so that the temperature at the power bridge within the die is less than a maximum operating temperature.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

Similarly, it is to be noticed that the term 'connected', also used in the claims, should not be interpreted as being limitative to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

BRIEF DESCRIPTION OF THE DRAWINGS

The invention will be better understood when reading the following description of embodiments of the invention, given in reference to the drawings where FIG. 1 diagrammatically shows a prior art antenna circuit driving circuit and FIG. 2 diagrammatically shows a circuit according to the invention.

DETAILED DESCRIPTION OF THE INVENTION

The invention is based on the recognition that the transistors of a power bridge for a high power sine wave carrier circuit may be integrated on the same die as the other components of the circuit, albeit the power dissipation in the power bridge. This recognition is derived from the fact that the sine wave is essentially emitted as bursts, and that heat may be dissipated in between successive bursts. Partial time operation of the sine wave generator thus makes it possible to integrate all elements of the generator on the same die. The invention therefore suggests providing a shutdown-pin on the circuit, thus allowing the circuit to be shut down for dissipating energy between bursts.

The invention also provides a solution for operating the circuit; it suggests taking into account thermal behavior of different kind of packages and of different locations on the die itself for determining the operation of the circuit. This is contrary to the general practice in the art, where temperature on a given die is considered to be uniform, if not constant when the operation of the circuit is considered.

In the circuit of the invention, the rejection for the second harmonic frequency is preferably higher than 30 dB, while the rejection for the third harmonic frequency and higher harmonic frequencies is preferably higher than 35 dB. The power of the sine wave at the output of the circuit—that is the power applied to the antenna is higher than 1 W; it may for instance be comprised between 1 and 5 W. The internal power of the circuit is higher than 1.5 W, and could be comprised between 1.5 and 6.5 W.

Figure 1:
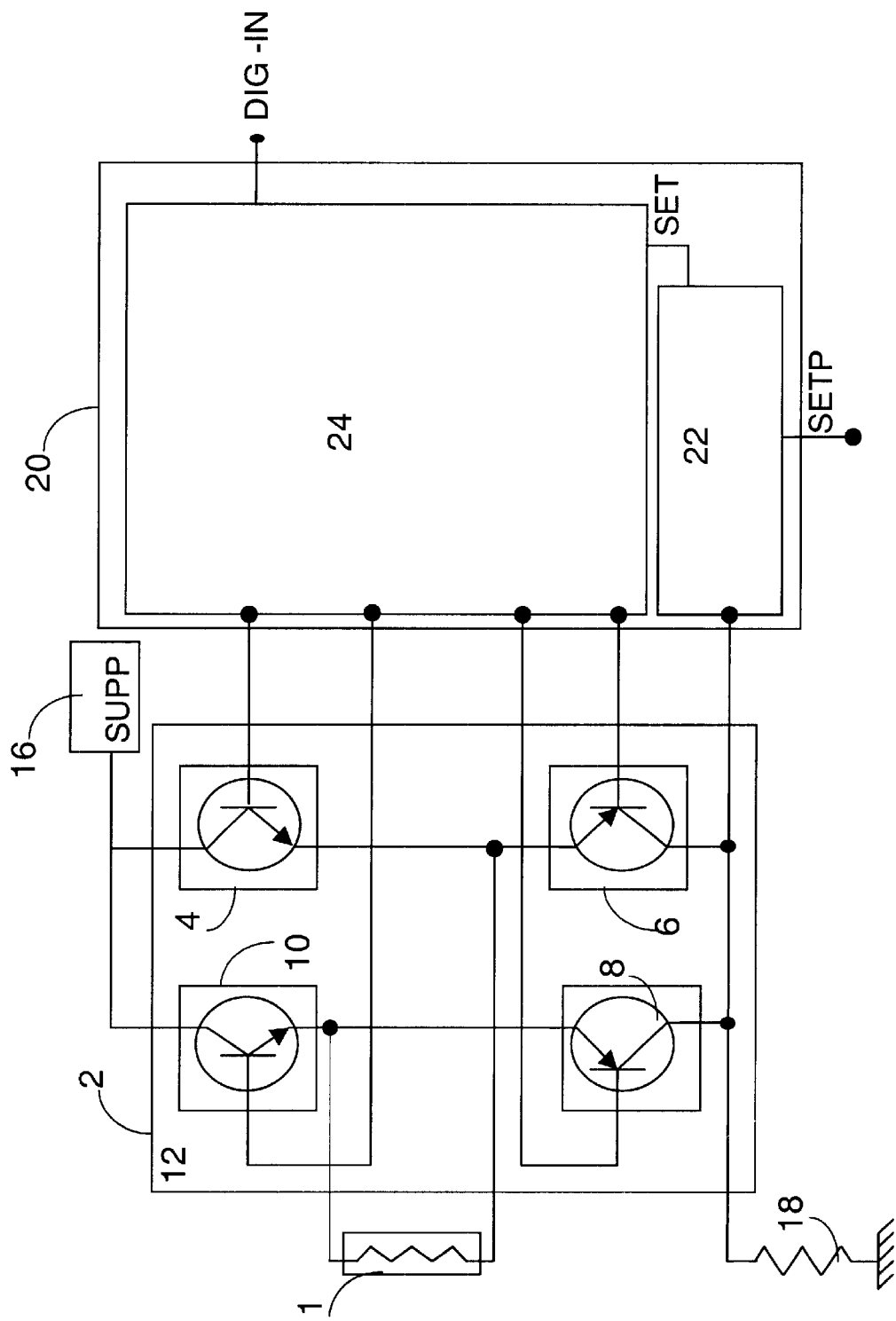
Figure 2:
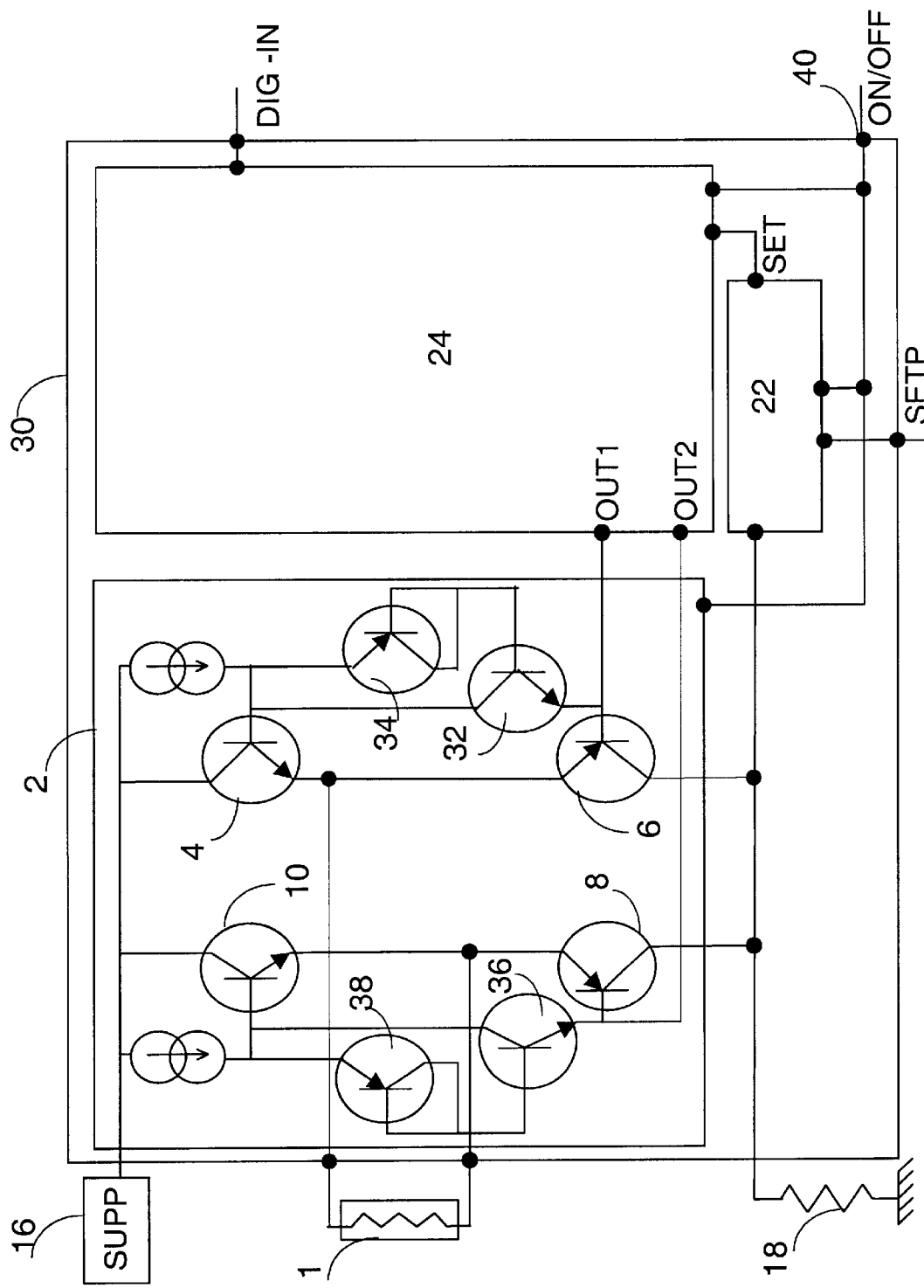

FIG. 2 shows a circuit according to the invention. All components already discussed in FIG. 1—save antenna 1 and sense resistor 18—are located on a same die 30. The circuit integrated on the die has pins for connecting the antenna 1 and the resistor 18, as well as pins for receiving reference voltage SETP, digital inputs ON/OFF and DIG-IN, and power supply SUPP. The circuit may be embodied in an application specific integrated circuit (ASIC).

The H-bridge or load feeding power bridge 2 of FIG. 2 is similar to the one of FIG. 1; however, since the transistors of the bridge are integrated, they may be matched one to the other. This also allows the bridge to be mounted as a class AB amplifier: obtaining such an amplifier was not possible in the prior art solution using separate components for each of the transistors. The H-bridge of FIG. 2 comprises not only four transistors 4, 6, 8, 10 mounted as in FIG. 1 but also two additional transistors mounted between the bases of the transistors forming each leg of the H-bridge. Specifically, the first leg of the bridge is formed a series connection of NPN transistor 4 and PNP transistor 6. For this first leg 4, 6, the collector of NPN transistor 32 and the emitter of PNP transistor 34 are connected to the base of transistor 4. The collector of transistor 34 is connected to its own base, and at the same time to the base of transistor 32. The emitter of transistor 32 is connected of the base of transistor 6. The second leg of the bridge is formed of the series connection of NPN transistor 10 and PNP transistor 8. NPN transistor 36 and PNP transistor 38 are mounted on the second leg of the bridge, as transistors 32 and 34 on the first leg.

Antenna 1 is connected in the middle of each legs, that is between the emitter of NPN transistor 4 and the collector of PNP transistor 6 on the one hand, and between the emitter of NPN transistor 10 and the collector of PNP transistor 8 on the other hand. The bridge according to the invention is a push-pull circuit allowing power dissipation in the H-bridge to as low as possible. The quiescent current at crossover is more limited in the circuit of FIG. 2 than in the circuit of FIG. 1.

FIG. 2 also shows the regulator 22, as well as the sine generator 24. The operation of the regulator and of the sine generator is similar to the operation of the regulator and of the sine generator disclosed in the European patent application with application number 99402881.9. The regulator and the sine generator may be implemented as discussed in this document; other embodiments of the regulator and sine generator are possible. Specifically, the two outputs OUT1 and OUT2 of the sine generator are connected to the bases of transistors 6 and 8.

According to the invention, there is provided a shutdown pin on the circuit. The shutdown pin 40 ON/OFF is connected to the sine generator 24, to the regulator 22 and to the bridge 2. Thank to the shutdown pin, all components on the die may be shut down for allowing cooling off.

The operation of the circuit of FIG. 2 is similar to the operation of the circuit of FIG. 1. However, the H-bridge acting as a class AB amplifier improves performance of the circuit, and lowers the amount of heat dissipation. In addition, the circuit is shutdown for allowing cooling off.

Operation of the circuit will be better understood from the following description of a possible method for operating the circuit. In a first step, the duty cycle DUC of the circuit is determined. The duty cycle DUC of the circuit is constrained by the maximum average temperature θmax on the die. θmax depends on the technology used for integrating the die. Specifically, assume $I_0$ is the internal current in the circuit, $V_{supply}$ is the voltage applied to the circuit, $I_{load}$ is the root means square RMS value of the current in the load in a powering step, $V_{load}$ is the root means square RMS value of the voltage across the load, R is the thermal resistance between the die and the air around the die, and θair the temperature of the air around the die.

$I_0$, $V_{supply}$, $I_{load}$ and $V_{load}$ actually depend on the load and on the power supply to the circuit, and do not depend on a specific implementation of the circuit. R depends on the type of the package. θair depends on the operating conditions for the die. All these parameters may be determined according to the contemplated operating conditions of the circuit.

In such a case the duty cycle is computed so as to allow cooling off for the circuit when the circuit is shut down. Thus, the duty cycle is lower than the ratio:

$$DUC\_max = \frac{\theta max - \theta air}{R \cdot (I_0 \cdot V_{supply} + I_{load} \cdot (V_{supply} - V_{load}))}$$

The lower term in this ratio is representative of the increase of temperature in the circuit when it is powered whereby $(I_0 \cdot V_{supply} + I_{load} \cdot (V_{supply} - V_{load}))$ is representative of the power dissipated in the circuit.

This constraint on the duty cycle ensures that the mean temperature in the die will remain lower than the maximum temperature.

Once the duty cycle for the circuit is determined, the invention suggests taking into account thermal behavior of different packages and of the die, for determining the maximum continuous duration of operation of the circuit τmax. This method is contrary to the general practice in the art, where temperature on a given die is considered to be uniform. Specifically, the invention suggests providing a thermal model of the different elements of the circuit, and notably of the transistors of bridge 2. The thermal model takes into account the thermal resistance and the thermal capacity of the elements of the die. Thermal behavior of the circuit when it is powered may then be simulated, e.g. using electrical simulation tools; in this case, voltage is representative of temperature, while current is representative of power. Using such a thermal model, thermal behavior of the elements of the circuit over time may be determined. This makes it possible to take into account not only the average temperature of the die, but also local increase of temperature inside of the die; thus, the invention makes it possible to take into account higher temperatures in the die, around transistors of the power bridge.

This second step makes it possible to compute, for a given design of the die, the maximum duration τmax of continuous operation of the circuit. Duration τmax is the duration in which a maximum allowed temperature is reached in any given point of the die. As discussed above, this approach is contrary to the approach generally used in the art, where local increase of temperature inside of a die are not taken into account.

Once the duty cycle and the maximum duration of continuous operation of the circuit are computed, operation of the circuit may be determined. The sequence of powering and shut down for the circuit should allow the circuit to cool off between each powering step, so that the maximum local temperature is not reached, while the average temperature also remains below θmax.

A first solution is to allow the circuit to operate for the maximum possible duration τmax before a shut down step. The circuit is then allowed to cool for a duration τoff. For this solution, in order to respect the duty cycle, the duration τoff should be computed so that $$\frac{\tau max}{\tau max + \tau off} \leq DUC\_max$$

In other words, for such operation of the circuit, where the circuit is powered on for the maximum possible duration τmax, the cooling off period τoff is determined by the duty cycle.

The operation of the circuit is not limited to this solution. For instance, the powering step may be shorter than the longest possible powering step, in which case it may not be necessary to let the circuit cool off for a long period of time. More generally, the constraint of the operation of the circuit may be expressed as follows: in any time period equal to the ratio of said maximum duration to said duty cycle, the energy applied to the circuit is less than an upper limit, the upper limit being the energy applied to the circuit by a powering step of said maximum duration. This criterion ensures that the duty cycle is respected, while allowing the circuit to cool off sufficiently so that the maximum temperature is never reached in the die.

This criterion may write:

$$\int_{t}^{\Delta t} Pcircuit \cdot dt \leq Pmean\Delta t$$

where t is any time instant;

Δt is the ratio of the maximum duration of continuous operation τmax to the duty cycle;

Pmean is the mean power dissipated in the circuit in a continuous period of operation of τmax;

Pcircuit is the power dissipated in the circuit.

The invention thus provides a circuit integrated on a single die, for a high power sine generator. Thanks to the shut down pin ON/OFF 40, partial time working of the circuit is possible, while temperature constraints in the circuit are respected.

The invention is however not limited to the embodiments disclosed above, nor to the specific regulator used in the preferred embodiment. Notably, the structure of the power-bridge may be varied, while still integrating the circuit on a single die. It is also possible that the shut down pin ON/OFF 40 be only connected to the power-bridge 2, and not to the regulator 22 and sine generator 24; this is less advantageous, but still possible in view of the fact that the power dissipated in the power bridge is higher than the power dissipated in the sine generator and in the regulator.

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is made only by way of example and not as a limitation on the scope of the invention, as defined in the appended claims.

What is claimed is:

1. A high power sine wave carrier circuit, comprising:
   a power bridge connected to the output of a sine generator;
   a regulator connected to a feedback output of the power bridge and providing a driving signal to the sine generator,
   wherein said power bridge, said sine generator and said sine regulator are integrated on a single die, and
   wherein said circuit further comprises a shutdown input.

2. The circuit of claim 1, wherein the sine wave at the output of said power bridge has a rejection higher than 30 dB for the second harmonic frequency and a rejection higher than 35 dB for the third and higher harmonic frequencies.

3. The circuit of claim 1, wherein the power of the sine wave at the output of said power bridge is higher than 1 W.

4. The circuit of claim 1, wherein the internal power of the circuit is higher than 1.5 W.

5. The circuit of claim 1, wherein the shutdown input controls operation of said power bridge, said regulator and said sine generator.

6. The circuit of claim 1, wherein the power bridge is a H-bridge.

7. The circuit of claim 5, wherein the power bridge is a push-pull bridge with matched transistors.

8. A process for applying a high power sine wave to a load connected to the output of a power bridge of a circuit comprising a power bridge connected to the output of a sine generator, a regulator connected to a feedback output of the power bridge and providing a driving signal to the sine generator, said power bridge, said sine generator and said regulator are integrated on a single die, and wherein said circuit further comprises a shutdown input, comprising the steps of powering and shutting down said circuit, and wherein:
   the duty cycle between said powering and shutting down steps is determined according to a maximum average temperature of the die;
   the maximum duration of a powering step is determined according to temperature at any point within the die; and
   in any time period equal to the ratio of said maximum duration to said duty cycle, the energy applied to said circuit is less than an upper limit, said upper limit being the energy applied to said circuit by a powering step of said maximum duration.

9. The process of claim 8, wherein said duty cycle is equal or less than:

$$\frac{\theta_{max} - \theta_{air}}{R \cdot (I_0 \cdot V_{supply} + I_{load} \cdot (V_{supply} - V_{load}))}$$

where $I_0$ is the internal current in said circuit, $V_{supply}$ is the voltage applied to said circuit, $I_{load}$ is the RMS value of the current in the load in a powering step, $V_{load}$ is the RMS value of the voltage across the load, R is the thermal resistance between the die and the air around the die, $\theta_{max}$ is the maximum average temperature of the die, and $\theta_{air}$ the temperature of the air around the die.

10. The process of claim 8, wherein the maximum duration of a powering step is determined so that the temperature at any point within the die is less than a maximum operating temperature.

11. The process of claim 10, wherein the maximum duration of a powering step is determined so that the temperature at the power bridge within the die is less than a maximum operating temperature.

12. A process for applying a high power sine wave to a load connected to the output of a power bridge of a circuit comprising a power bridge connected to the output of a sine generator, a regulator connected to a feedback output of the power bridge and providing a driving signal to the sine generator, said power bridge, said sine generator and said regulator are integrated on a single die, and wherein said circuit further comprises a shutdown input, wherein said process comprises powering and shutting down said circuit, and wherein:
   the duty cycle between said powering and shutting down said circuit is determined according to a maximum average temperature of the die;
   the maximum duration of powering said circuit is determined according to temperature at any point within the die; and
   in any time period equal to the ratio of said maximum duration to said duty cycle, the energy applied to said circuit is less than an upper limit, said upper limit being the energy applied to said circuit by said maximum duration of powering said circuit.

13. The process of claim 12, wherein said duty cycle is equal or less than:

$$\frac{\theta_{max} - \theta_{air}}{R \cdot (I_0 \cdot V_{supply} + I_{load} \cdot (V_{supply} - V_{load}))}$$

where $I_0$ is the internal current in said circuit, $V_{supply}$ is the voltage applied to said circuit, $I_{load}$ is the RMS value of the current in the load in said powering of said circuit, $V_{load}$ is the RMS value of the voltage across the load, R is the thermal resistance between the die and the air around the die, $\theta_{max}$ is the maximum average temperature of the die, and $\theta_{air}$ the temperature of the air around the die.

14. The process of claim 12, wherein the maximum duration of powering said circuit is determined so that the temperature at any point within the die is less than a maximum operating temperature.

15. The process of claim 14, wherein the maximum duration of powering said circuit is determined so that the temperature at the power bridge within the die is less than a maximum operating temperature.

* * * * *